United States Patent

Lokas

(10) Patent No.: US 10,003,309 B2
(45) Date of Patent: Jun. 19, 2018

(54) ADAPTIVE SELF-BIAS

(71) Applicant: Telefonaktiebolaget LM Ericsson (Publ), Stockholm (SE)

(72) Inventor: Jadran Lokas, Ottawa (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days. days.

(21) Appl. No.: 15/304,399

(22) PCT Filed: Apr. 23, 2014

(86) PCT No.: PCT/IB2014/060955
§ 371 (c)(1),
(2) Date: Oct. 14, 2016

(87) PCT Pub. No.: WO2015/162454
PCT Pub. Date: Oct. 29, 2015

(65) Prior Publication Data
US 2017/0047900 A1    Feb. 16, 2017

(51) Int. Cl.
*H03F 1/32*    (2006.01)
*G06F 1/28*    (2006.01)
(Continued)

(52) U.S. Cl.
CPC .......... *H03F 1/3247* (2013.01); *G06F 1/28* (2013.01); *H03F 1/0266* (2013.01);
(Continued)

(58) Field of Classification Search
CPC .................................. H03F 1/3247; G06F 1/28
(Continued)

(56) References Cited

U.S. PATENT DOCUMENTS 5,451,907 A * 9/1995 Keane ..................... H03F 1/304
330/289
6,137,354 A    10/2000 Dacus et al.
(Continued)

FOREIGN PATENT DOCUMENTS

| EP | 1 594 222 A1 | 11/2005 |
|---|---|---|
| WO | 2003038993 A2 | 5/2003 |
| WO | 2004055972 A1 | 7/2004 |

OTHER PUBLICATIONS

International Search Report and Written Opinion dated Jan. 20, 2015 for International Application Serial No. PCT/IB2014/060955, International Filing Date: Apr. 23, 2014 consisting of 10-pages.
(Continued)

*Primary Examiner* — Patricia T Nguyen
(74) *Attorney, Agent, or Firm* — Patent Portfolio Builders, PLLC

(57) ABSTRACT

A method and system for adaptive self-biasing of a power amplifier are disclosed. A current (Ids) at an output of the power amplifier is measured, the current being a sum of a quiescent current (Idq) and a current arising from an RF signal applied to an input of the power amplifier. An output signal power (Pout) of the power amplifier is measured. A target value of Ids corresponding to the measured value of Pout is either calculated or obtained from a look-up table. The measured current Ids is compared to the target value of Ids to determine an error value. An input biasing voltage (Vgs) of the power amplifier is adjusted based on the error value to achieve a measured value of Ids that is equal to the target value of Ids corresponding to the measured value of Pout.

20 Claims, 6 Drawing Sheets

(51) Int. Cl.
*H03F 1/02* (2006.01)
*H03F 1/30* (2006.01)
*H03F 3/19* (2006.01)
*H03F 3/21* (2006.01)

(52) U.S. Cl.
CPC ........... *H03F 1/0272* (2013.01); *H03F 1/301* (2013.01); *H03F 3/19* (2013.01); *H03F 3/21* (2013.01); *H03F 2200/105* (2013.01); *H03F 2200/321* (2013.01); *H03F 2200/447* (2013.01); *H03F 2200/451* (2013.01); *H03F 2200/462* (2013.01); *H03F 2200/465* (2013.01); *H03F 2200/78* (2013.01); *H03F 2201/3233* (2013.01)

(58) Field of Classification Search
USPC .................................................. 330/285, 296
See application file for complete search history.

(56) References Cited

U.S. PATENT DOCUMENTS

| | | |
|---|---|---|
| 6,765,443 B2 | 7/2004 | Pehike |
| 7,986,186 B2 | 7/2011 | Marbell et al. |
| 2002/0130646 A1* | 9/2002 | Zadeh ................... G05F 1/575 323/275 |
| 2004/0164800 A1* | 8/2004 | Joffe ...................... H03F 3/217 330/251 |
| 2013/0113447 A1* | 5/2013 | Kadanka ................. G05F 1/56 323/280 |
| 2014/0191807 A1* | 7/2014 | Qin .......................... H03F 3/21 330/296 |
| 2014/0210558 A1* | 7/2014 | Matsumoto ............... H03F 3/21 330/296 |
| 2015/0061769 A1* | 3/2015 | Bodnar ................ H03G 3/3042 330/282 |

OTHER PUBLICATIONS

Sahu et al.—"Adaptive Power Management of Linear RF Power Amplifiers in Mobile Handsets—An Integrated System Design Approach," IEEE Asia Pacific Microwave Conference Aug. 5, 2004 consisting of 4-pages.

Texas Instruments. "Optimizing RF Power Amplifier System Efficiency Using DC-DC Converters," Literature No. SNVA593, 2011, Texas Instruments Incorporated consisting of 10-pages.

\* cited by examiner

ADAPTIVE SELF-BIAS

CROSS-REFERENCE TO RELATED APPLICATIONS

This application is a Submission Under 35 U.S.C. § 371 for U.S. National Stage Patent Application of International Application Number: PCT/IB2014/060955, filed Apr. 23, 2014 entitled "ADAPTIVE SELF-BIAS," the entirety of which is incorporated herein by reference.

FIELD OF THE INVENTION

The present invention relates to power amplifiers and in particular to adaptively biasing a power amplifier.

BACKGROUND

Power amplifiers are used in radio transmitters installed at base stations of a wireless communication network, such as in evolved node B (eNB) base stations in long term evolution (LTE) wireless communication networks. These power amplifiers require DC biasing for proper performance at radio frequencies (RF). For example, a transistor technology popularly used in power amplifiers is laterally diffused metal oxide semiconductor field effect transistors (LDMOSFET). Other technologies include Gallium Nitride (GaN). In either of these two technologies, as well as other technologies, various DC biasing techniques are used.

Using LDMOS as an example, the LDMOS transistors are designed for high frequency and high power operation. However, these devices are limited by significant drifts of quiescent current (Idq) at a fixed gate bias voltage (Vgs) as temperature varies, due to the charge build-up in the drain-gate region that is caused by hot carrier injection effects. The quiescent current (Idq) changes proportionally with both the gate bias voltage (Vgs) and temperature. To maintain the maximum output power with high linearity, the Idq should be constant over time across all operating temperatures. To achieve this, the Vgs should be adjusted during operation to compensate for temperature changes.

FIG. 1 shows a block diagram of a known LDMOS bias control circuit 10 using a digital to analog converter (DAC) 12 and a temperature sensor 14 to control a bias voltage at the input 16 of a power amplifier 18. At a fixed gate bias voltage (Vgs), the drain current (ids) drifts as temperature changes. Below a zero crossover point, Ids increases with higher temperature. Above this point Ids increases with lower temperature.

In order to keep Idq constant over the operating temperature range, a micro-controller unit (MCU) 20 measures the temperature changes using the temperature sensor via an analog to digital converter 21 and sets a new bias voltage via the DAC 12. A look-up table 22 provides a gate voltage (Vgs) for a given drain current (Ids) at a given temperature. The Vgs from the lookup table is fed to the DAC 12 which converts the Vgs to an analog DC biasing voltage. Note that the drain current (Ids) is equal to the quiescent drain current (Idq) plus the current induced by the RF signal (Irf) applied to the power amplifier 18. Note also that Ids may be directly controlled by the drain voltage supply 23. The drain voltage ideally remains constant over temperature. The drain current may be measured by an analog to digital converter (ADC) and current sensor 24. In FIG. 1, the dashed lines represent the signal and control lines from and to the MCU 20 used for controlling Vgs, and the solid lines represent the conventional signal and biasing lines of a power amplification system. Further, the feedback receiver 30 and the pre-distortion engine 28, are for conventional pre-distortion functions and the DC blocking components 31 are for isolating the DC biasing voltages.

A known procedure for keeping the drain current (Idq) constant over temperature is as follows:

Pre-store the Vgs vs. temperature data in the look-up table 22;

Measure temperature periodically; and

Control, via the MCU 20, the DAC 12 output voltage for a new Vgs voltage using the look-up table 22.

To ensure proper performance of the power amplifier 18 over temperature, a constant quiescent drain current (Idq) is desired. In the method described above for attempting to keep a constant Idq, temperature is used as an address to select an appropriate gate voltage (Vgs) value to be applied to the input 16 of the power amplifier 18. A problem with the above-described method is that a value of VGS needed to obtain a constant Idq varies from device to device. This variation is so significant that each power amplifier must be calibrated during production to develop a custom look-up table to select Vgs for a given Idq. Average Vgs versus temperature is captured experimentally by measuring four to eight units, often from the same lot, over the operating temperature range. This data is then used for all radios that use the same power amplifier. Normal radio production volumes are in excess of tens of thousands and variations from unit to unit are significant.

A known procedure for generating a Vgs look-up table 22 is as follows:

(a) Select 4 to 8 units already mounted into a power amplifier prototype board and place them into a temperature chamber at a starting temperature of 25 degrees Celsius (C.);

(b) Apply Vgs to each of the units to drive the Idq to a desired level;

(c) Record each Vgs;

(d) Lower the temperature to a desired minimum, (e.g., −40 degrees C.), and repeat steps b and c;

(e) Increase temperature by 5 degrees C. and repeat steps b and c;

(f) Keep repeating step e until the maximum temperature is reached (e.g., 60 degrees C.);

(g) Generate an over-temperature Vgs curve for each transistor;

(h) Normalize all generated curves such that they intercept each other at 25 degrees C.; and (i) Average all curves to produce a final generic over-temperature curve.

During the radio manufacturing process, each transistor on the power amplifier board is calibrated to select Vgs at 25 degrees C. This value is used in conjunction with a generic Vgs over-temperature curve to generate look-up data that is stored in the look-up table 22. The procedure described above is labor intensive and slow. Further, these steps do not account for changes arising from long term aging of the transistor. Also, the drain voltage 23 applied to the power amplifier 18 may be lowered to achieve greater efficiency when there is a power headroom in the power amplifier 18 or when operating the power amplifier 18 at levels lower than designed for, Lowering the drain voltage 23 reduces the drain current Ids, which in turn requires re-calibration and new values for the look-up table 22. Further, if the Vgs-temperature data of the look-up table 22 is lost in the field, the radio must be returned to the factory for re-calibration.

SUMMARY

Methods and systems for adaptive self-biasing of a power amplifier are disclosed. According to one aspect, the invention provides a method of adaptively biasing a power amplifier. The method includes measuring a signal power, Pout, that is proportional to an output power of the power amplifier. The method includes measuring a current, Ids, at an output of the power amplifier, the current being a sum of a quiescent current, Idq, and a current arising from an RF signal applied to an input of the power amplifier. A target value of Ids is determined, the target value of Ids corresponding to the measured value of Pout. The measured current ids is compared to the target value of Ids to determine an error value. An input biasing voltage, Vgs, of the power amplifier is adjusted based on the error value to achieve, at the output of the power amplifier, a measured value of Ids that is equal to the target value of Ids corresponding to the measured value of Pout.

According to this aspect, in some embodiments, a target value of Ids for a given value of Pout are the same for each of a plurality of similarly manufactured power amplifiers. In some embodiments, the target values of Ids are obtained from a look-up table that has values of Ids corresponding to Pout that are pre-determined to achieve a constant quiescent current, Idq, at the output of the power amplifier. In some embodiments, the value of Pout is measured at an output of a feedback receiver that provides feedback to a pre-distortion engine. In some embodiments, the adjusting is continuously performed to drive the error value toward zero. In some embodiments, the method further includes initially setting a biasing voltage applied to the power amplifier to zero to produce a resultant current, measuring the resultant current, and increasing the biasing voltage until the resultant current reaches a predetermined level. In some embodiments, the method further includes monitoring the resultant output power of the power amplifier, applying an RF signal to an input of the power amplifier, and increasing a power of the applied RF signal until a desired output power is achieved.

According to another aspect, the invention provides a power amplifier biasing system for establishing a bias voltage of a power amplifier, the power amplifier having an input and an output. The system includes a power detector configured to measure a signal power, Pout, that is proportional to an output power of the power amplifier. The system also includes a current sensor configured to measure an output current, Ids, at the output of the power amplifier. The measured current, Ids, is a sum of a quiescent current, Idq, and a current arising from application of an RF signal to the input of the power amplifier. A memory is configured to store a look-up table having target values of Ids corresponding to measured Pout values. A comparator determines a difference between the measured Ids and a target value of Ids from the look-up table corresponding to the measured value of Pout. A bias voltage adjuster adjusts the bias voltage, Vgs, at the input of the power amplifier to drive the measured Ids to the target value of Ids corresponding to the measured value of Pout.

According to this aspect, in some embodiments, the system further includes a processor, wherein the bias voltage adjuster and comparator are implemented using programmatic software instruction that are executed by the processor and the memory is accessible by the processor. In some embodiments, the look-up table is addressed by an index corresponding to Pout. In some embodiments, the look-up table target values of Ids are the same for each of a plurality of similarly manufactured power amplifiers. In some embodiments, the look-up table has values of Ids corresponding to Pout that are pre-determined to achieve a constant quiescent current, Idq, at the output of the power amplifier. In some embodiments, the system further includes a pre-distortion engine configured to pre-distort a signal input to the power amplifier and a feedback receiver configured to provide feedback to the pre-distortion engine, the feedback receiver having an output. The value of Pout is measured at the output of the feedback receiver.

According to yet another aspect, the invention provides a processor. The processor is configured to receive a measured value of an output power, Pout, of the power amplifier. The processor is also configured to receive a measured value of an output current, ids, of a power amplifier. A target value of Ids is obtained by the processor, the target value being based on the measured output power, Pout. The processor also determines a difference between the measured value of the output current, Ids, and the obtained target value of Ids. The processor also generates an adjustment operable to set a biasing voltage of the power amplifier based on the determined difference.

According to this aspect, in some embodiments, the adjustment s calculated to drive the difference to zero. In some embodiments, the processor is further configured to initially cause the biasing voltage to be zero and to determine a resultant current. The processor may further be configured to cause an increase in the biasing voltage until the resultant current reaches a predetermined level, and to monitor a resultant output power of the power amplifier. In some embodiments, the processor is further configured to cause application of an RF signal to an input of the power amplifier and to cause the applied RF signal to increase until a desired output power is achieved.

According to yet another aspect, the invention provides a computer readable non-transitory medium, storing instructions that, when executed by a processor, cause the processor to perform steps that include: determine a difference between a measured value of an output current, Ids, of a power amplifier and a target value of Ids. The target value of Ids is based on a value of a measured output power of the power amplifier. The processor is also caused by the instructions to generate an adjustment applicable to change a biasing voltage of the power amplifier based on the determined difference. According to this aspect, the stored instructions further cause the processor to retrieve the target value of Ids from the look-up table.

DETAILED DESCRIPTION OF THE INVENTION

Figure 1:
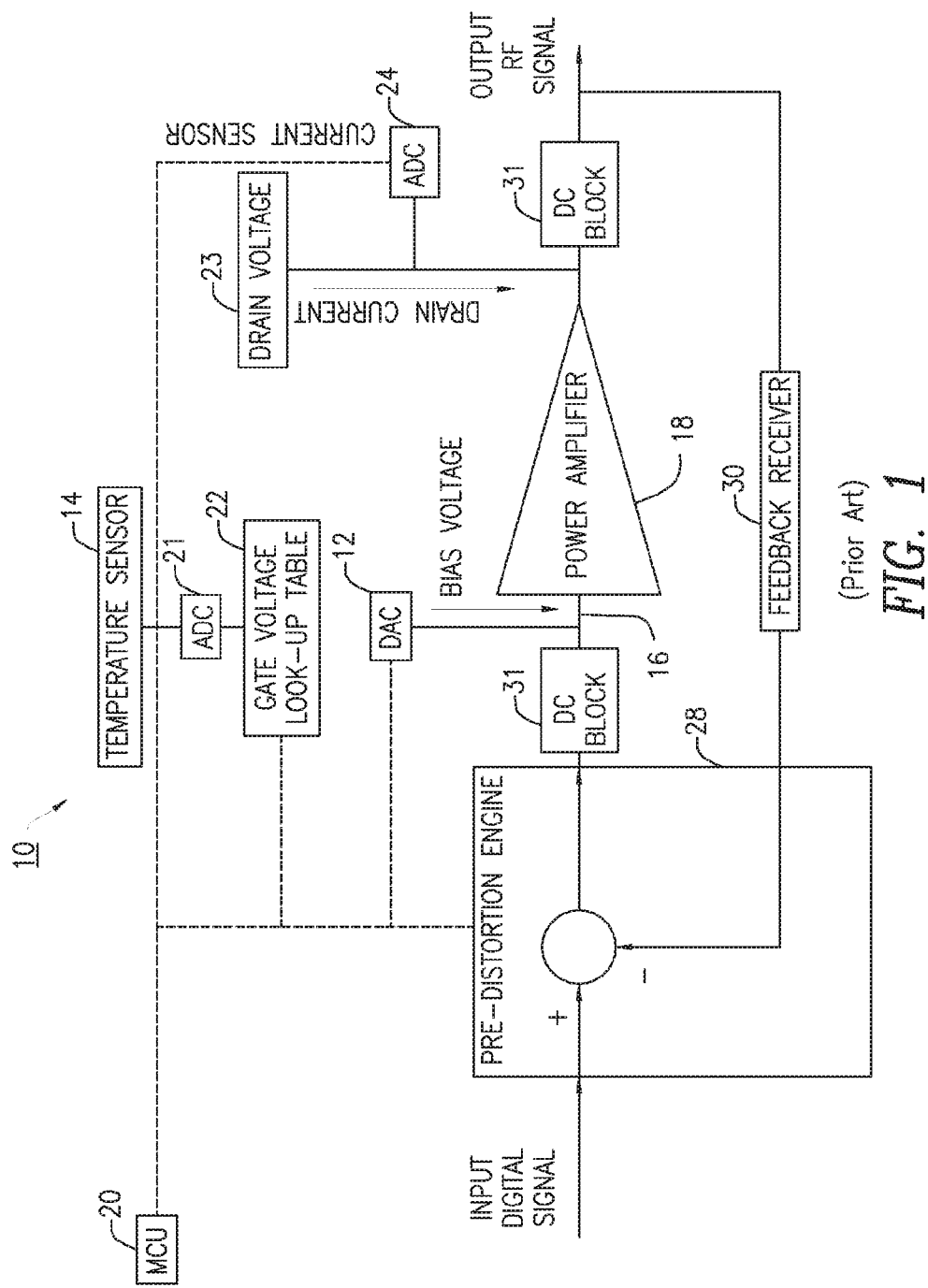
FIG. 1 is a block diagram of a known power amplification system.

Before describing in detail example embodiments that are in accordance with the present disclosure, it is noted that the embodiments reside primarily in combinations of apparatus components and processing steps related to adaptive self-biasing of power amplifiers. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

According to some embodiments described herein, a true feedback system to bias power amplifier transistors is provided. A look-up table having power amplifier output power (Pout) versus total output current (Ids) (drain current for LDMOS devices) is used in place of the input voltage (Vgs) (gate voltage for LDMOS) vs. temperature look-up table described above. Alternatively, Ids may be calculated in accordance with an equation relating ids to Pout. Measurement of current may be performed on a continuous basis and real time corrections to Vgs may be made as Ids attempts to move away from a desired level during operation of the power amplifier.

Figure 2:
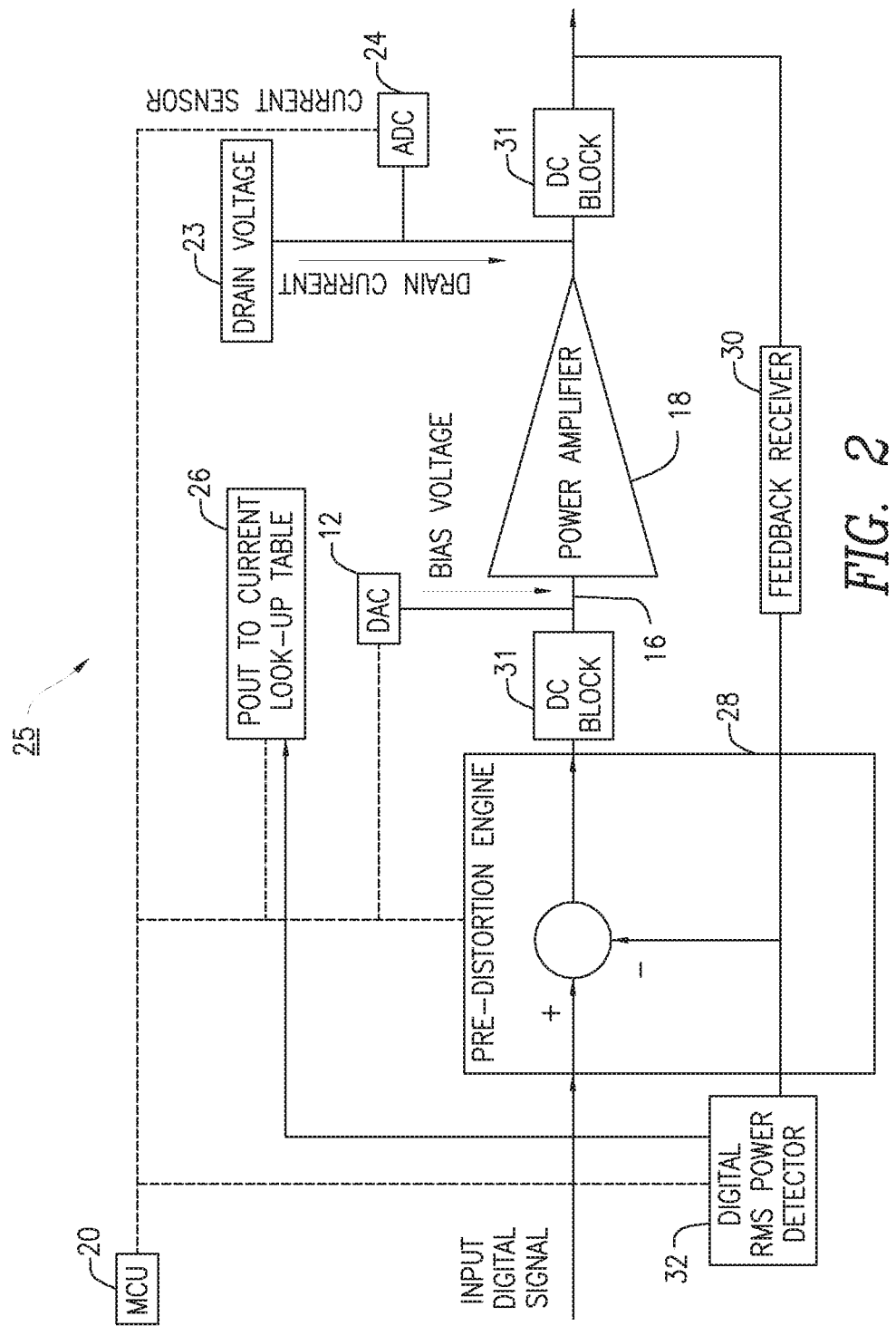
FIG. 2 is a block diagram of an adaptively self-biasing power amplification system constructed according to principles of the present invention.

A block diagram of a power amplification system 25 constructed in accordance with principles of the present invention is shown in FIG. 2. In FIG. 2, the dashed lines represent the signal and control lines from and to the MCU 20 used for controlling Vgs, and the solid lines represent the conventional signal and biasing lines of a power amplification system. The system 25 includes a look-up table 26 that includes output current versus output power values (Ids v. Pout). In particular, the look-up table 26 may be addressed by Pout to point to a particular value of Ids corresponding to the value of Pout that addressed the look-up table 26.

The Pout values are provided by a power detector 32 that receives a measure of the output power via a feedback receiver 30. In addition to providing power feedback to the power detector 32, the feedback receiver 30 also provides feedback to the pre-distortion engine 28. The pre-distortion engine pre-distorts the signal input to the power amplifier 18 at the input 16. Note that the feedback receiver 30 is calibrated during manufacture to have a constant gain. The power detector 32 is used to monitor the signal strength at the feedback receiver 30 and determine Pout based on the signal strength and the known gain of the feedback receiver 30.

The embodiment of FIG. 2 shows that the MCU 20 receives an Ids value from the look-up table 26 and determines a digital value of Vgs calculated to drive the measured value of Ids to the target value of Ids stored in the look-up table 26. The digital value of Vgs may be sent to the DAC 12 from the MCU 20 directly. The DAC 12 converts this digital value of Vgs to an analog biasing voltage. Nate also, that the MCU 20 may be implemented as a microcontroller, a conventional programmable microprocessor, a digital signal processor, a floating point gate array, application specific integrated circuitry, or other suitable implementation capable of performing the functions described in relation to MCU 20. Further, the look-up table 26 may be incorporated into the MCU 20 or as a standalone memory. Alternatively, the correspondence between Pout and Ids can be described by an equation or function that is computable by the MCU 20, instead of values being stored in a look-up table.

Thus, sonic embodiments include a power amplifier biasing system for establishing a bias voltage at an input 16 of a power amplifier 18. The system includes a current sensor using an ADC 24 configured to measure an output current, Ids, at the output of the power amplifier 18. The measured output current, Ids, is a sum of a quiescent current, Idq, and a current, Irf, arising from application of an RF signal to the input 16 of the power amplifier 18. The system also includes a power detector 32 configured to measure a signal power, Pout, that is proportional to or equal to an output power of the power amplifier 18. A memory is configured to store a look-up table 26 having target values of Ids corresponding to measured values of Pout. A comparator determines a difference between the measured Ids and a target value of Ids from the look-up table 26 corresponding to the measured value of Pout. A bias voltage adjuster adjusts the bias voltage, Vgs, from the DAC 12 at the input 16 of the power amplifier 18 to drive the measured output current Ids to the target value of Ids from the look-up table 26 corresponding to the measured value of Pout.

Figure 3:
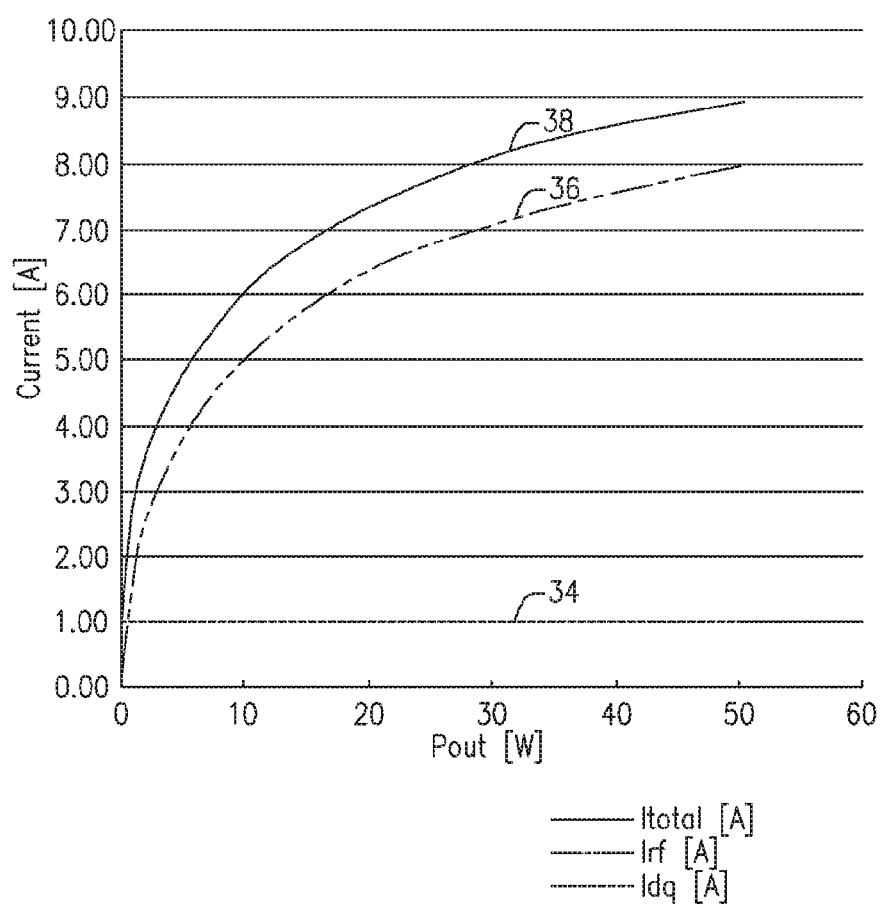
FIG. 3 is a graph of components of an output current versus output power of a power amplifier.

When a power amplifier is designed, a number of current measurements are taken to assess the power consumption and efficiency of the device at various radio frequency (RF) power levels. Modem power amplifiers can be as efficient as 40% at full power and as inefficient as 0% when idle with only quiescent drain current (Idq) and with no RF signal applied. FIG. 3 shows a graph of example quiescent current Idq 34, RF current Irf 36 and total output current Ids 38, versus Pout, where Ids=Idq+Irf. Idq is the quiescent drain current drawn by the power amplifier 18 in the absence of an applied RE signal and Irf is the drain current drawn by the power amplifier due to the presence of an RF signal. One design goal is to keep the same curve, Ids vs. Pout, at any operating temperature for a plurality of similarly manufactured power amplifiers. Since the quiescent current Idq cannot be measured directly, total current versus output power, Ids vs. Pout, serves as a mechanism for achieving a constant Idq, indirectly, as described below.

Embodiments described herein result in faster development time since there is no need for over-temperature characterization of a number of power amplifier units and since there is no per-unit data needed. The resultant performance spread over a number of radios is much narrower. The power amplifier parameters that may exhibiting much lower statistical spread include efficiency, close-in emissions, gain, etc. Also, a temperature sensor is not required. The method can be applied to radios that are already designed and deployed. Further, the adaptive biasing system described herein allows for changing the output voltage drain voltage in an LDMOS device) without recalibration.

Figure 4:
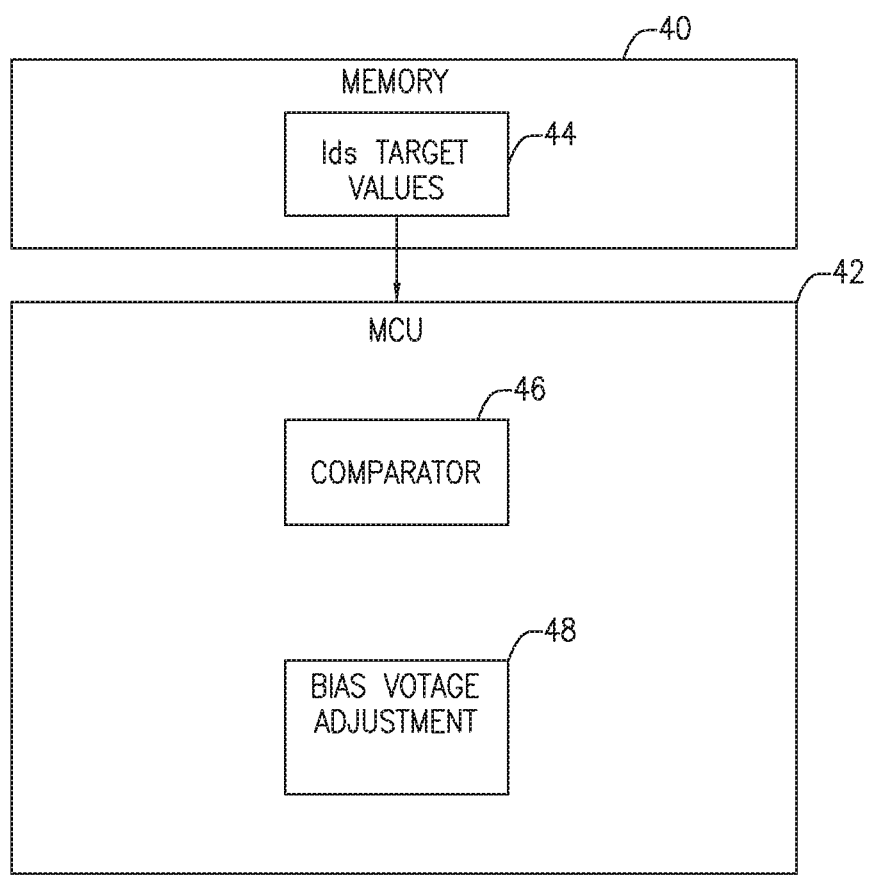
FIG. 4 is a block diagram of a memory and microcontroller unit (MCU) constructed according to principles of the present invention.

FIG. 4 is a block diagram of a memory 40 and a microcontroller unit (MCU) 42. The microcontroller controller unit may be a programmable processor or an application specific integrated circuit, for example. The memory 40 stores the Ids look-up table 26 having Ids values 44 that correspond to Pout values that address the look-up table 26. The MCU 42 is programmable to perform the functions of a comparator 46 and a bias voltage adjustor 48, In operation, the comparator 46 compares a looked-up value of Ids to a measured value of the output current, Ids. To the extent that the looked-up value of ids and the measured value of Ids are different, the bias voltage adjustor 48 causes the DAC 12 to adjust the gate voltage (Vgs) 45 until the looked-up Ids value is equal to the measured Ids value for the Observed value of Pout.

Table 1 is a sample table of Ids versus Pout that may be stored in a look-up table. These values are mere examples, and the invention is not limited to these particular values. More or fewer entries may be implemented and interpolation may be used to determine values between table entries.

TABLE 1

| Pout [W] | Ids [A] |
|---|---|
| 50 | 8.91 |
| 49 | 8.88 |
| 48 | 8.84 |
| 47 | 8.81 |
| 46 | 8.78 |
| 45 | 8.75 |
| 44 | 8.71 |
| 43 | 8.67 |
| 42 | 8.64 |
| 41 | 8.60 |
| 40 | 8.56 |
| 39 | 8.52 |
| 38 | 8.48 |
| 37 | 8.43 |
| 36 | 8.39 |
| 35 | 8.34 |
| 34 | 8.29 |
| 33 | 8.24 |
| 32 | 8.18 |
| 31 | 8.13 |
| 30 | 8.07 |
| 29 | 8.01 |
| 28 | 7.95 |
| 27 | 7.88 |
| 26 | 7.81 |
| 25 | 7.74 |
| 24 | 7.67 |
| 23 | 7.59 |
| 22 | 7.50 |
| 21 | 7.42 |
| 20 | 7.32 |
| 19 | 7.23 |
| 18 | 7.12 |
| 17 | 7.01 |
| 16 | 6.90 |
| 15 | 6.77 |
| 14 | 6.64 |
| 13 | 6.50 |
| 12 | 6.35 |
| 11 | 6.18 |
| 10 | 6.00 |
| 9 | 5.80 |
| 8 | 5.59 |
| 7 | 5.35 |
| 6 | 5.08 |
| 5 | 4.78 |
| 4 | 4.43 |
| 3 | 4.02 |
| 2 | 3.50 |
| 1 | 2.80 |
| 0 | 1.00 |

Figure 5:
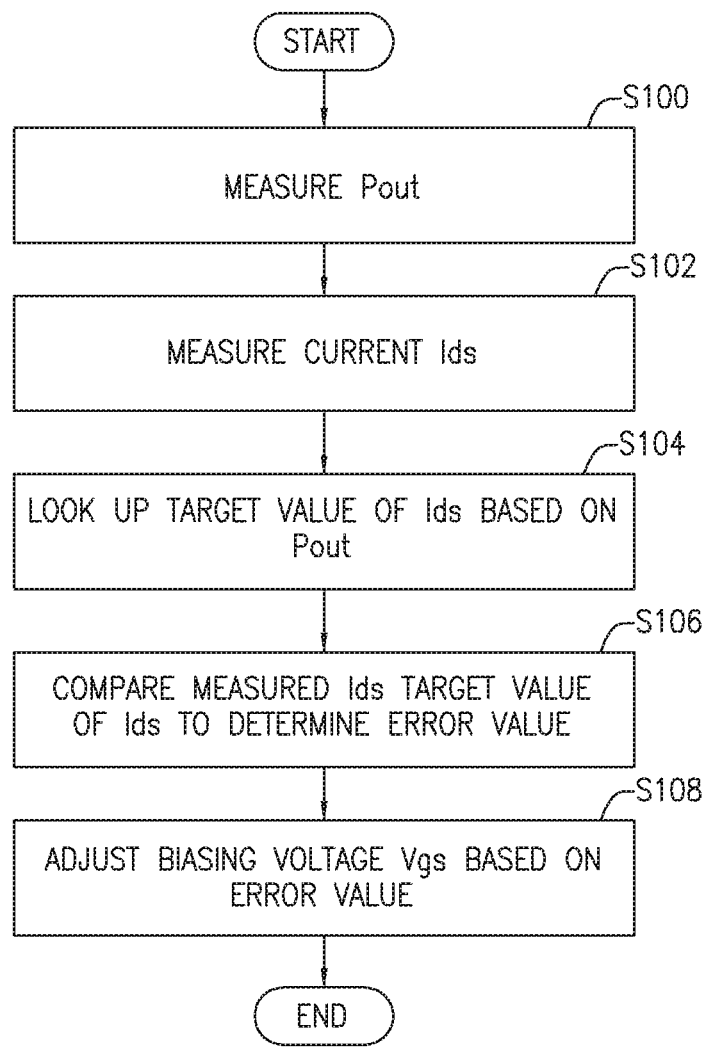
FIG. 5 is a flowchart of an exemplary process for adaptive self-biasing of a power amplifier according to principles of the present invention.

FIG. 5 is a flowchart of an exemplary process for self-biasing of a power amplifier. The power output, Pout, of the power amplifier is measured by the power detector 28 (block S100) The current Ids is measured by a current sensor which may be implemented by the ADC 24 (block S102). A value of Ids is retrieved from the took-up table 26 that corresponds to the measured value of Pout (block S104). The looked-up value of Ids is compared to the measured value of output current, Ids, measured by the ADC 24 to determine an error value (block S106). The biasing voltage Vgs applied to the input 16 of the power amplifier 18 is adjusted via the DAC 12 based on the error value (block S108).

In some embodiments, the look-up table target values of Ids are the same for each of a plurality of similarly manufactured power amplifiers. In some embodiments, the took-up table has target values of Ids corresponding to Pout that are pre-calibrated to achieve a constant quiescent current, Idq, at the output of the power amplifier. In sonic embodiments, the target values of Ids are computed via an equation with Pout as a variable of the equation. In some embodiments, the value of Pout is measured at an output of a feedback receiver that provides feedback to a pre-distortion engine. In some embodiments, the adjusting is continuously performed to drive the error value toward zero.

Figure 6:
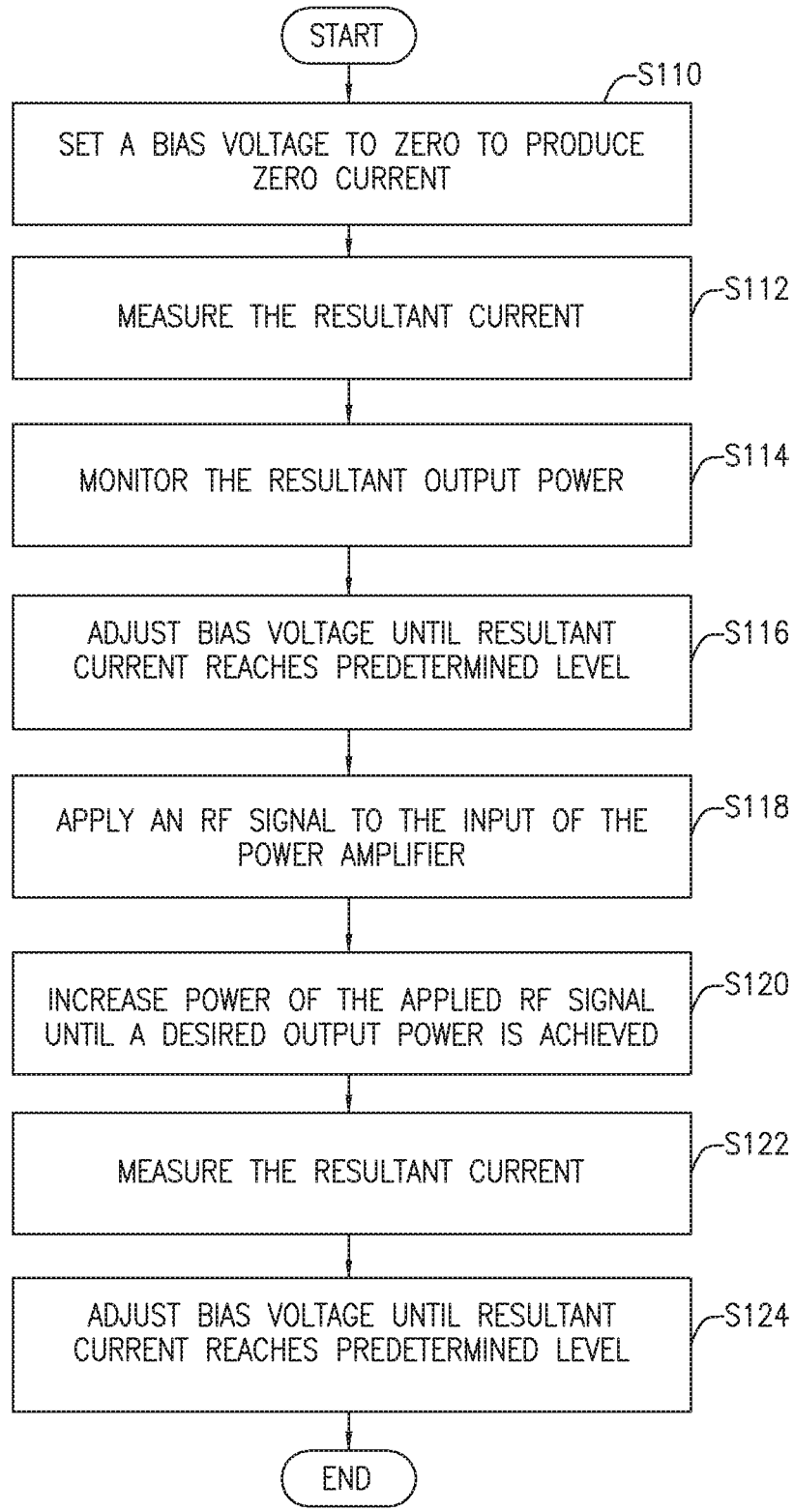
FIG. 6 is a flowchart of an exemplary process for initializing an adaptively self-biasing power amplification system upon power-up of the radio unit according to principles of the present invention.

FIG. 6 is a flowchart of an exemplary process of initializing the self-biasing power amplification system 24 upon power-up of the radio unit. A biasing voltage Vgs is set to zero to produce a resultant drain current (block S110). The resultant current is monitored (block S112). The resultant output power is also monitored (block S114). The biasing voltage is adjusted until the resultant current reaches a predetermined level based on look-up table data (block S116). An RE signal is applied to the input 16 of the power amplifier 18 (block S118). The power of the applied RF signal is increased until a desired output power is detected (block S120). The resultant current is monitored (block S122). The biasing voltage is adjusted until the resultant current reaches a pre-determined level based on look-up table data (block S124).

Referring again to FIG. 2, an example of a detailed procedure for biasing the power amplifier 18 may be summarized as follows.

(a) DAC 12 output is set to Vgs=0 volts;
(b) Drain voltage 23 is turned on;
(c) ADC 24 measures the Ids level;
(d) DAC 12 ramps up Vgs at a predetermined rate until ADC 24 reports that IDS has reached a predetermined level;
(e) Monitor Pout;
(f) Apply an RF signal to the power amplifier 18 until a desired Pout is achieved;
(g) Observe measured Pout and measured Ids;
(h) Compare measured Ids to the Ids value provided by the look-up table 26 for the measured Pout; and
(i) Adjust Vgs until measured Ids equals IDS from the look-up table for the measured value of Pout.

Note that this approach and apparatus provide a true feedback loop for keeping a constant output current, Ids, that ideally does not vary with age of the power amplifier or temperature. Also, if the drain voltage 23 is changed to achieve a more efficient Idq, and consequently, a new Ids, the adaptive system described above will continue to drive Idq and Ids to a desired level automatically.

Note that although LIMOS technology is discussed herein, the invention is not limited to this technology, but rather, applies as well to other semiconductor technologies, such as GaN. Thus, generally speaking, Ids is an output current of a power amplifier, drain voltage can indicate the biasing output voltage of the power amplifier, Vgs can indicate a biasing input voltage of the power amplifier, and Idq indicates the quiescent output current of the power amplifier.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method of adaptively biasing a power amplifier, the method comprising:
   measuring a signal power, Pout, that is proportional to an output power of the power amplifier;
   measuring a current, Ids, at an output of the power amplifier, the current being a sum of a quiescent current, Idq, and a current arising from an RF signal applied to an input of the power amplifier;
   determining a target value of Ids, the target value of Ids corresponding to the measured value of Pout;
   comparing the measured current Ids to the target value of Ids to determine an error value; and
   adjusting an input biasing voltage, Vgs, of the power amplifier based on the error value to achieve, at the output of the power amplifier, a measured value of Ids that is equal to the target value of Ids corresponding to the measured value of Pout.

2. The method of claim 1, wherein a target value of Ids for a given value of Pout is the same for each of a plurality of similarly manufactured power amplifiers.

3. The method of claim 1, wherein the target values of Ids are obtained from a look-up table that has values of Ids corresponding to Pout that are pre-determined to achieve a constant quiescent current, Idq, at the output of the power amplifier.

4. The method of claim 1, wherein the value of Pout is measured at an output of a feedback receiver that provides feedback to a pre-distortion engine.

5. The method of claim 1, wherein the adjusting is continuously performed to drive the error value toward zero.

6. The method of claim 1, further comprising:
   initially setting a biasing voltage applied to the power amplifier to zero to produce a resultant current;
   measuring the resultant current; and
   increasing the biasing voltage until the resultant current reaches a predetermined level.

7. The method of claim 6, further comprising:
   monitoring a resultant output power of the power amplifier;
   applying an RF signal to the input of the power amplifier; and
   increasing a power of the applied RF signal until a desired output power is achieved.

8. A power amplifier biasing system for establishing a bias voltage of a power amplifier, the power amplifier having an input and an output, the system comprising:
   a power detector configured to measure a signal power, Pout, that is proportional to an output power of the power amplifier;
   a current sensor configured to measure an output current, Ids, at the output of the power amplifier, the measured current, Ids, being a sum of a quiescent current, Idq, and a current arising from application of an RF signal to the input of the power amplifier;
   a memory configured to store a look-up table having target values of Ids corresponding to measured Pout values;
   a comparator configured to determine a difference between the measured Ids and a target value of Ids from the look-up table corresponding to the measured value of Pout; and
   a bias voltage adjuster configured to adjust the bias voltage, Vgs, at the input of the power amplifier to drive the measured Ids to the target value of Ids corresponding to the measured value of Pout.

9. The power amplifier biasing system of claim 8, further comprising a processor, wherein the bias voltage adjuster and comparator are implemented using programmatic software instructions that are executed by the processor and the memory is accessible by the processor.

10. The power amplifier biasing system of claim 8, wherein the look-up table is addressed by an index corresponding to Pout.

11. The power amplifier biasing system of claim 8, wherein the look-up table target values of Ids are the same for each of a plurality of similarly manufactured power amplifiers.

12. The power amplifier biasing system of claim 8, wherein the look-up table has values of Ids corresponding to Pout that are pre-determined to achieve a constant quiescent current, Idq, at the output of the power amplifier.

13. The power amplifier biasing system of claim 8, further comprising:
   a pre-distortion engine configured to pre-distort a signal input to the power amplifier; and
   a feedback receiver configured to provide feedback to the pre-distortion engine, the feedback receiver having an output,
   wherein the value of Pout is measured at the output of the feedback receiver.

14. A processor, the processor configured to:
   receive a measured value of an output power, Pout, of a power amplifier;
   receive a measured value of an output current, Ids, of the power amplifier;
   obtain a target value of Ids, the target value being based on the measured output power, Pout;
   determine a difference between the measured value of the output current, Ids, and the obtained target value of Ids; and
   generate an adjustment operable to set a biasing voltage of the power amplifier based on the determined difference.

15. The processor of claim 14, wherein the adjustment is calculated to drive the difference to zero.

16. The processor of claim 14, further configured to initially cause the biasing voltage to be zero and to determine a resultant current.

17. The processor of claim 16, further configured to cause an increase in the biasing voltage until the resultant current reaches a predetermined level, and to monitor a resultant output power of the power amplifier.

18. The processor of claim 17, further configured to cause application of an RF signal to the input of the power amplifier and to cause the applied RF signal to increase until a desired output power is achieved.

19. A computer readable non-transitory medium, storing instructions that, when executed by a processor, cause the processor to:
   determine a difference between a measured value of an output current, Ids, of a power amplifier and a target value of Ids, the target value of Ids being based on a value of a measured output power of the power amplifier; and
   generate an adjustment applicable to change a biasing voltage of the power amplifier based on the determined difference.

20. The computer readable non-transitory medium of claim 19, wherein the stored instructions further cause the processor to retrieve the target value of Ids from a look-up table.

* * * * *